United States Patent
Taniguchi et al.

(10) Patent No.: US 12,301,196 B2
(45) Date of Patent: May 13, 2025

(54) FILTER DEVICE AND RADIO-FREQUENCY FRONT END CIRCUIT INCLUDING THE SAME

(71) Applicant: Murata Manufacturing Co., Ltd., Nagaokakyo (JP)

(72) Inventors: Tetsuo Taniguchi, Nagaokakyo (JP); Masayuki Kikuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 244 days.

(21) Appl. No.: 18/105,298

(22) Filed: Feb. 3, 2023

(65) Prior Publication Data

US 2023/0188110 A1    Jun. 15, 2023

Related U.S. Application Data

(63) Continuation of application No. PCT/JP2021/028945, filed on Aug. 4, 2021.

(30) Foreign Application Priority Data

Sep. 15, 2020   (JP) ................... 2020-154409

(51) Int. Cl.
*H03H 7/01* (2006.01)
*H01F 27/28* (2006.01)
(Continued)

(52) U.S. Cl.
CPC ....... *H03H 7/0115* (2013.01); *H01F 27/2804* (2013.01); *H01F 27/292* (2013.01);
(Continued)

(58) Field of Classification Search
CPC ......... H03H 2001/0085; H03H 7/0115; H01P 1/20345
(Continued)

(56) References Cited

U.S. PATENT DOCUMENTS

2007/0120627 A1   5/2007   Kundu
2010/0321130 A1*  12/2010  Kim ................. H03H 7/48
                                           333/101
(Continued)

FOREIGN PATENT DOCUMENTS

JP   2009-517920 A   4/2009
JP   2013-128232 A   6/2013
(Continued)

OTHER PUBLICATIONS

Official Communication issued in International Patent Application No. PCT/JP2021/028945, mailed on Sep. 21, 2021.

*Primary Examiner* — Rakesh B Patel
(74) *Attorney, Agent, or Firm* — Keating & Bennett, LLP

(57) ABSTRACT

A filter device includes a dielectric substrate, first and second ground electrodes connected to a ground terminal, and resonators between the ground electrodes and electromagnetically coupled to each other. The ground electrodes are at different positions in a normal direction of the dielectric substrate. Each of the resonators includes a first capacitor electrode partially overlapping with the first ground electrode in plan view of the dielectric substrate, a second capacitor electrode partially overlapping with the second ground electrode in plan view of the dielectric substrate, and a via connecting the capacitor electrodes. The resonators include a first resonator connected to an input terminal, a second resonator connected to an output terminal, and a third resonator between the first and second resonators. Shunt electrodes are connected to the via and the ground terminal in the first and second resonators, respectively.

19 Claims, 10 Drawing Sheets

(51) Int. Cl.
    *H01F 27/29*     (2006.01)
    *H01G 4/012*     (2006.01)
    *H01G 4/30*     (2006.01)
    *H01P 1/203*     (2006.01)
    *H03H 1/00*     (2006.01)

(52) U.S. Cl.
    CPC ............... *H01G 4/012* (2013.01); *H01G 4/30* (2013.01); *H01P 1/20345* (2013.01); *H03H 7/0161* (2013.01); *H01F 2027/2809* (2013.01); *H03H 2001/0085* (2013.01)

(58) Field of Classification Search
    USPC .................................. 333/175, 185, 204, 205
    See application file for complete search history.

(56) References Cited

U.S. PATENT DOCUMENTS

| | | |
|---|---|---|
| 2013/0154769 A1 | 6/2013 | Masuda |
| 2017/0288633 A1* | 10/2017 | Asada ................. H01P 1/20345 |
| 2019/0123771 A1 | 4/2019 | Takeuchi et al. |
| 2019/0173447 A1 | 6/2019 | Oishi |
| 2019/0305745 A1 | 10/2019 | Taniguchi |

FOREIGN PATENT DOCUMENTS

| | | |
|---|---|---|
| JP | 2019-079865 A | 5/2019 |
| WO | 2018/034103 A1 | 2/2018 |
| WO | 2018/100923 A1 | 6/2018 |

\* cited by examiner

FILTER DEVICE AND RADIO-FREQUENCY FRONT END CIRCUIT INCLUDING THE SAME

CROSS REFERENCE TO RELATED APPLICATIONS

This application claims the benefit of priority to Japanese Patent Application No. 2020-154409 filed on Sep. 15, 2020 and is a Continuation Application of PCT Application No. PCT/JP2021/028945 filed on Aug. 4, 2021. The entire contents of each application are hereby incorporated herein by reference.

BACKGROUND OF THE INVENTION

1. Field of the Invention

The present disclosure relates to a filter device and a radio-frequency front end circuit including the same, and, more particularly, to techniques for improving the characteristics of a multilayer LC filter.

2. Description of the Related Art

A filter device which includes multiple LC resonators is known. For example, WO 2018/100923 discloses a band-pass filter which includes multiple LC resonators galvanically isolated from a ground node by capacitors. As the LC resonators of the band-pass filter are galvanically isolated by the ground node, the ground electrode and other conductors connected to the ground electrode are inhibited from functioning as inductors when a current flows through the ground electrode and the conductors. This can prevent the characteristics of the band-pass filter from deviating from desired characteristics.

SUMMARY OF THE INVENTION

The band-pass filter disclosed in WO 2018/100923 primarily allows adjustment of attenuation characteristics of the higher-frequency side of a passband. However, depending on the characteristics of a device adopting the band-pass filter, adjustments may be needed to the attenuation characteristics of the lower-frequency side of the passband as well.

Preferred embodiments of the present invention provide filter devices each including multiple LC resonators and achieving improved attenuation characteristics in the non-passbands, which are at a higher-frequency side and a lower-frequency side of a passband.

A filter device according to a preferred embodiment of the present disclosure includes a dielectric substrate, a first ground electrode and a second ground electrode connected to the ground terminal, and a plurality of resonators located between the first ground electrode and the second ground electrode and electromagnetically coupled to each other. The first ground electrode and the second ground electrode are located at different positions in a normal direction of the dielectric substrate. A plurality of resonators are located between the first ground electrode and the second ground electrode. Each of the plurality of resonators includes a first capacitor electrode partially overlapping with the first ground electrode and a second capacitor electrode partially overlapping with the second ground electrode, in plan view of the dielectric substrate from the normal direction, and at least one first via connecting the first capacitor electrode and the second capacitor electrode. The plurality of resonators includes a first resonator connected to the input terminal, a second resonator connected to the output terminal, and a third resonator between the first resonator and the second resonator. The filter device also includes at least one of a first shunt electrode connected to the first via included in the first resonator and the ground terminal, and a second shunt electrode connected to the first via included in the second resonator and the ground terminal.

A filter device according to a preferred embodiment of the present disclosure includes the resonators each including the capacitor electrodes (the first capacitor electrode and the second capacitor electrode) partially overlapping with the two ground electrodes, respectively, and the via (the first via) connected between the capacitor electrodes. In at least one of the resonator connected to the input terminal and the resonator connected to the output terminal (the first resonator and the second resonator), the via, which defines an inductor, is connected to the ground terminal by the shunt electrode. This configuration allows adjustment to the attenuation characteristics on the lower-frequency side of the passband. Furthermore, a resonator circuit (the third resonator) located between the first resonator and the second resonator is galvanically isolated from the ground terminal. This configuration allows adjustment to the attenuation characteristics on the higher-frequency side of the passband. Accordingly, the filter device allows adjustment to the attenuation characteristics on both the higher-frequency side and the lower-frequency side of the passband.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
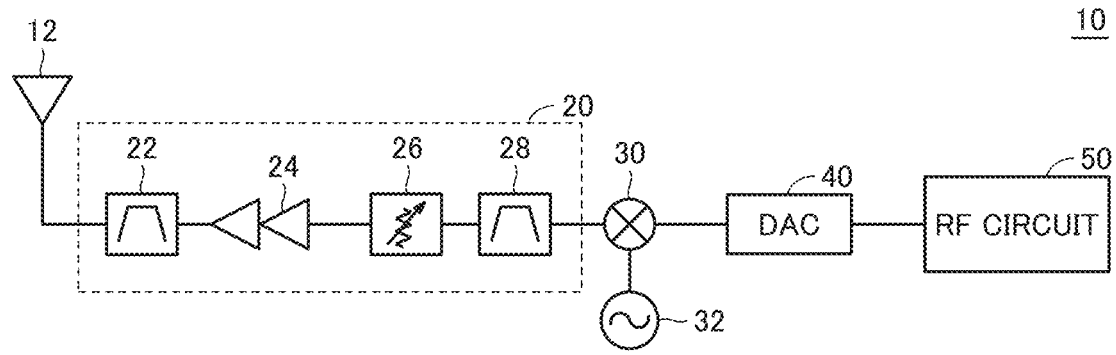
FIG. 1 is a block diagram of a communication device including a radio-frequency front end circuit to which a filter device according to Preferred Embodiment 1 of the present invention is applied.

Hereinafter, preferred embodiments according to the present disclosure will be described, with reference to the accompanying drawings. Note that like reference signs are used to refer to like or corresponding elements or features in the drawings, and the description thereof will not be repeated.

Preferred Embodiment 1

Basic Configuration of Communication Device

FIG. 1 is a block diagram of a communication device 10 including a radio-frequency (RF) front end circuit 20 to which a filter device according to Preferred Embodiment 1 is applied. For example, the communication device 10 is a cellular base station.

Referring to FIG. 1, the communication device 10 includes an antenna 12, the RF front end circuit 20, a mixer 30, a local oscillator 32, a digital-to-analog converter (DAC) 40, and an RF circuit 50. The RF front end circuit 20 includes band-pass filters 22 and 28, an amplifier 24, and an attenuator 26. Note that while FIG. 1 will be described with reference to the RF front end circuit 20 as including a transmitter circuit to transmit a RF signal through the antenna 12, the RF front end circuit 20 may include a receiver circuit to receive a RF signal via the antenna 12.

The communication device 10 upconverts a transmission signal transferred from the RF circuit 50 into an RF signal and emits the RF signal through the antenna 12. A modulated digital signal, which is the transmission signal output from the RF circuit 50, is converted into an analog signal by the digital-to-analog converter 40. The mixer 30 mixes the transmission signal, obtained by the digital-to-analog converter 40 converting the digital signal into the analog signal, with an oscillating signal from the local oscillator 32, and upconverts the mixed signal to an RF signal. The band-pass filter 28 filters out undesired waves caused by the upconversion and extracts only a transmission signal that is in a desired frequency band. The attenuator 26 adjusts the strength of the transmission signal. The amplifier 24 power-amplifies the transmission signal, having passed through the attenuator 26, to a predetermined level. The band-pass filter 22 filters out, from the transmission signal, undesired waves caused during the amplification process, and passes therethrough only a signal component that is in the frequency band defined by the communication standards. The transmission signal having passed the band-pass filter 22 is emitted through the antenna 12.

A filter device according to any of the preferred embodiments of the present disclosure can be adopted as the band-pass filters 22 and 28 included in the communication device 10 as described above.

Configuration of Filter Device

Figure 2:
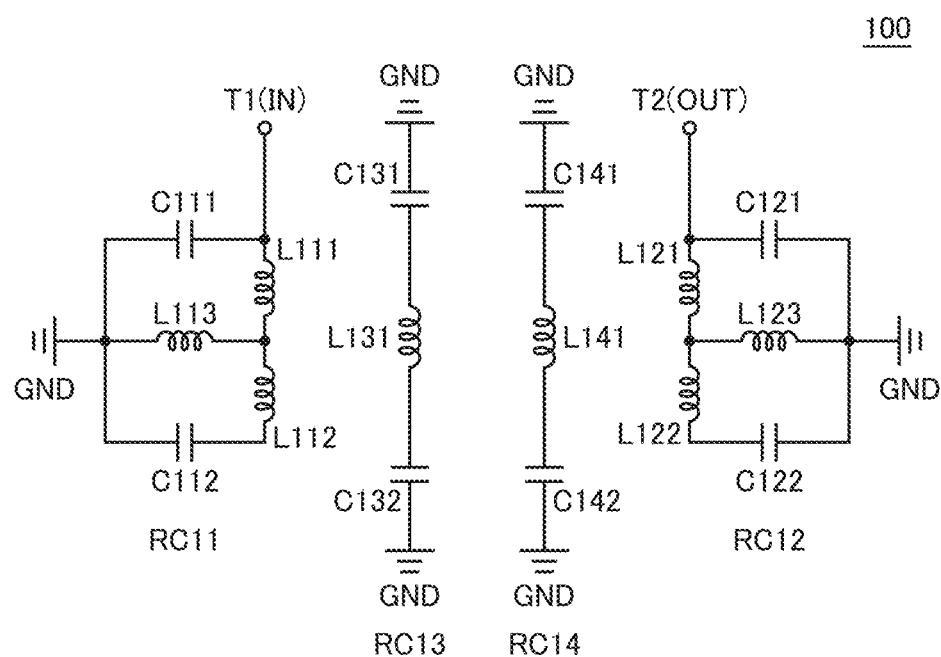
FIG. 2 is an equivalent circuit diagram of the filter device according to Preferred Embodiment 1 of the present invention.
Figure 3:
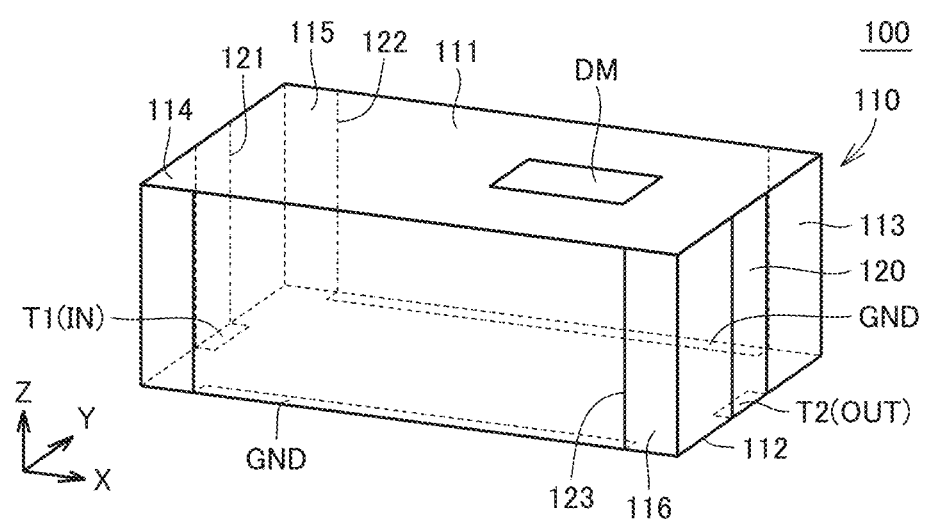
FIG. 3 is an external perspective view of the filter device of FIG. 2.
Figure 4:
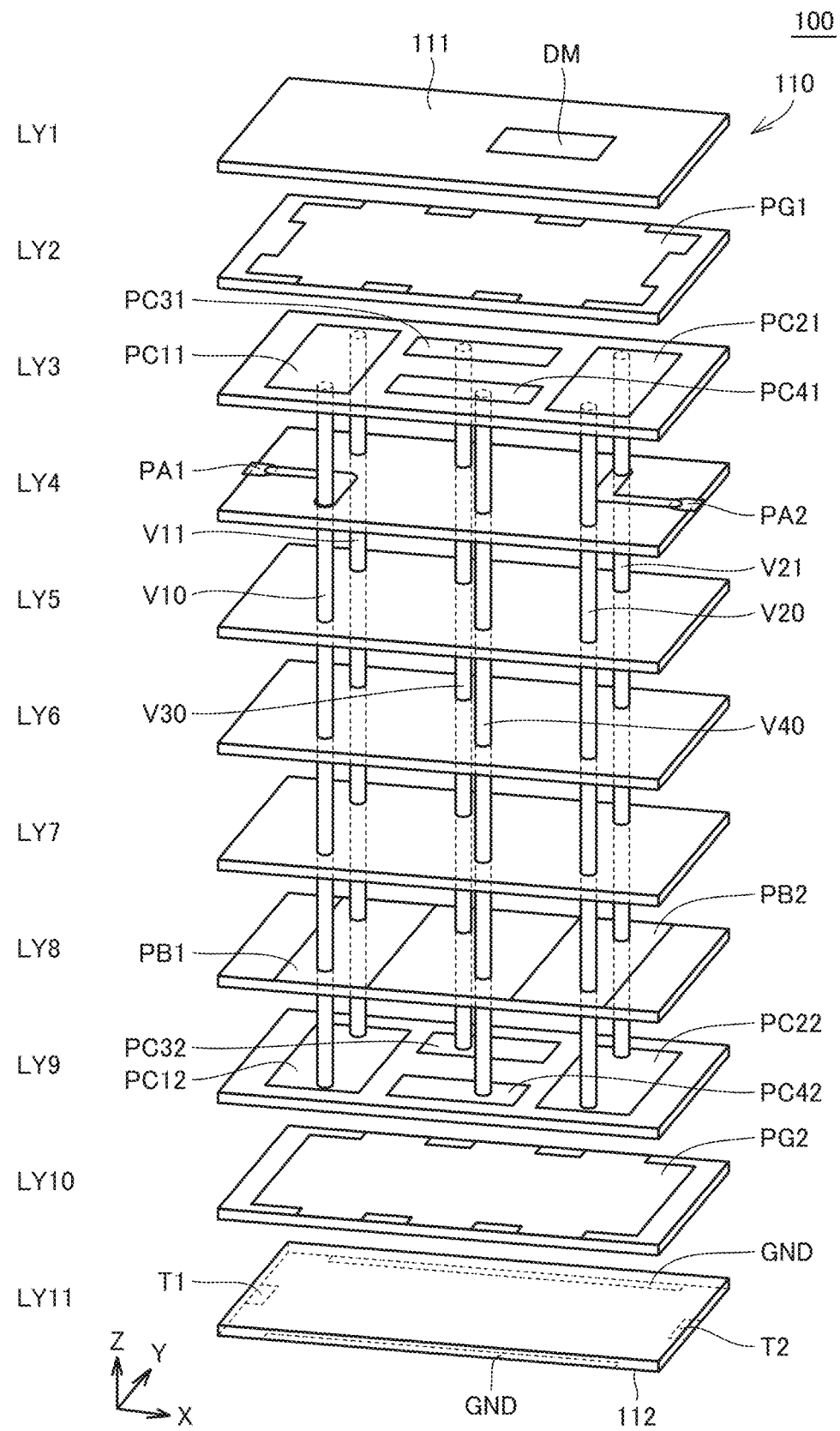
FIG. 4 is an exploded perspective view of one example of a multilayer structure of the filter device of FIG. 2.

Next, referring to FIGS. 2 through 4, a specific configuration of the filter device 100 according to Preferred Embodiment 1 is now described.

FIG. 2 is an equivalent circuit diagram of the filter device 100. Referring to FIG. 2, the filter device 100 includes an input terminal T1, an output terminal T2, a ground terminal GND, and resonators RC11, RC12, RC13, and RC14. The resonators RC11 through RC14 are each an LC resonator which includes an inductor and a capacitor. The resonator RC11 is connected to the input terminal T1. The resonator RC12 is connected to the output terminal T2. The resonators RC13 and RC14 are disposed between the resonator RC11 and the resonator RC12.

The resonator RC11 includes inductors L111, L112, and L113, and capacitors C111 and C112. The inductors L111 and L112 and the capacitor C112 are connected in series in the listed order between the input terminal T1 and the ground terminal GND. The inductor L113 is connected between the ground terminal GND and a connection node for the inductor L111 and the inductor L112. The capacitor C111 is connected between the input terminal T1 and the ground terminal GND.

The resonator RC12 includes inductors L121, L122, and L123 and capacitors C121 and C122. The inductors L121 and L122 and the capacitor C122 are connected in series in the listed order between the output terminal T2 and the ground terminal GND. The inductor L123 is connected between the ground terminal GND and a connection node for the inductor L121 and the inductor L122. The capacitor C121 is connected between the output terminal T2 and the ground terminal GND.

The resonator RC13 includes an inductor L131 and capacitors C131 and C132. The inductor L131 has one end connected to the ground terminal GND via the capacitor C131. The inductor L131 has the other end connected to the ground terminal GND via the capacitor C132. The inductor L131 is galvanically isolated from the ground terminal GND by the capacitors C131 and C132.

The resonator RC14 includes an inductor L141 and capacitors C141 and C142. The inductor L141 has one end connected to the ground terminal GND via the capacitor C141. The inductor L141 has the other end connected to the ground terminal GND via the capacitor C142. The inductor L141 is galvanically isolated from the ground terminal GND by the capacitors C141 and C142.

The resonators are electromagnetically coupled to each other. As such, the filter device 100 includes four stages of resonators disposed between the input terminal T1 and the output terminal T2, the resonators being electromagnetically coupled to each other. An RF signal input to the input terminal T1 is transferred through the electromagnetic coupling of the resonators RC11 through RC14, and output through the output terminal T2. At this time, a signal in a frequency band, determined by the resonance frequencies of the respective resonators, is transferred to the output terminal T2. In other words, the filter device 100 functions as a band-pass filter that passes a signal in the desired frequency band by adjusting the resonance frequencies of the resonators.

FIG. 3 is an external perspective view of the filter device 100. FIG. 4 is an exploded perspective view of one example of a multilayer structure of the filter device 100.

Referring to FIGS. 3 and 4, the filter device 100 includes a cuboid or generally cuboid dielectric substrate 110 including multiple dielectric layers LY1, LY2, LY3, LY4, LY5, LY6, LY7, LY8, LY9, LY10, and LY11 being stacked along a predetermined direction. The direction in which the dielectric layers LY1 through LY11 are stacked in the dielectric substrate 110 will be referred to as a stacking direction. Each dielectric layer of the dielectric substrate 110 is made of ceramics such as low temperature co-fired ceramics (LTCC) or a resin, for example. Within the dielectric substrate 110, multiple electrodes included in each dielectric layer and multiple vias included between the dielectric layers configure the inductors and the capacitors of the LC resonance circuits. Note that the "via," as used herein, refers to a conductor included in the dielectric layer to connect the electrodes included in different dielectric layers. For example, the via is formed by a conductive paste, plating, and/or a metal pin.

Note that, in the following description, the stacking direction for the dielectric substrate 110 will be referred to as a "Z-axis direction," a direction perpendicular to Z-axis direction and along a long side of the dielectric substrate 110 will be referred to as an "X-axis direction," and a direction along a short side of the dielectric substrate 110 will be referred to as a "Y-axis direction." In addition, in the following, the positive direction of Z-axis in the figures may be referred to as the upper side of the figures and the negative direction may be referred to as the lower side of the figures.

A directional marking DM is provided on the upper surface 111 (the dielectric layer LY1) of the dielectric substrate 110, to determine the direction of the filter device 100. The input terminal T1, the output terminal T2, and the ground terminal GND are disposed on the lower surface 112 (the dielectric layer LY11) of the dielectric substrate 110.

The input terminal T1, the output terminal T2, and the two ground terminals GND are plate-shaped electrodes. The input terminal T1 is disposed in contact with one side along Y-axis of the dielectric layer LY11. The input terminal T1 is connected to the side electrode 121 disposed on a side surface 114 of the dielectric substrate 110. The output terminal T2 is disposed in contact with the other side along Y-axis of the dielectric layer LY11. The output terminal T2 is connected to the side electrode 120 disposed on a side surface 113 of the dielectric substrate 110.

The two ground terminals GND are disposed in contact with the two sides along X-axis of the dielectric layer LY11, respectively. One ground terminal GND is connected to a side electrode 122 disposed on a side surface 115 of the dielectric substrate 110. The other ground terminal GND is connected to a side electrode 123 disposed on a side surface 116 of the dielectric substrate 110.

A plate-shaped ground electrode PG1 is disposed on the dielectric layer LY2 of the dielectric substrate 110. A plate-shaped ground electrode PG2 is disposed on the dielectric layer LY10 of the dielectric substrate 110. The ground electrodes PG1 and PG2 are connected to the ground terminals GND on the dielectric layer LY11 by the side electrodes 122 and 123.

The filter device 100 is connected to an external device, using the input terminal T1, the output terminal T2, and the ground terminals GND disposed on the lower surface 112 of the dielectric substrate 110, or the side electrodes 120 through 123.

The filter device 100 includes four stages of LC resonators, as described with respect to FIG. 2. More specifically, the filter device 100 includes a resonator RC11, a resonator RC12, a resonator RC13, and a resonator RC14. The resonator RC11 includes vias V10 and V11 and capacitor electrodes PC11 and PC12. The resonator RC12 includes vias V20 and V21 and capacitor electrodes PC21 and PC22. The resonator RC13 includes a via V30 and capacitor electrodes PC31 and PC32. The resonator RC14 includes a via V40 and capacitor electrodes PC41 and PC42.

The capacitor electrode PC11 is a rectangular or substantially rectangular plate electrode and disposed on the dielectric layer LY3. The capacitor electrode PC11, in plan view of the dielectric substrate 110 from the normal direction (Z-axis direction), partially overlaps with the ground electrode PG1 disposed on the dielectric layer LY2. The capacitor electrode PC11 and the ground electrode PG1 configure the capacitor C111 of FIG. 2. The capacitor electrode PC12 is a rectangular or substantially rectangular plate electrode and disposed on the dielectric layer LY9. The capacitor electrode PC12, in plan view of the dielectric substrate 110 from the normal direction, partially overlaps with the ground electrode PG2 disposed on the dielectric layer LY10. The capacitor electrode PC12 and the ground electrode PG2 configure the capacitor C112 of FIG. 2.

The capacitor electrode PC11 is connected to the capacitor electrode PC12 by the vias V10 and V11. The via V10 is connected to a connection electrode PA1 disposed on the dielectric layer LY4. The connection electrode PA1 is connected to the input terminal T1 via the side electrode 121.

The vias V10 and V11 are also connected to a shunt electrode PB1 disposed on the dielectric layer LY8. The shunt electrode PB1 is a strip-shaped plate electrode including a first end portion and a second end portion, the first end portion being connected to the side electrode 122, the second end portion being connected to the side electrode 123. In other words, the shunt electrode PB1 is connected between intermediate portions of the vias V10 and V11, and the ground terminal GND. The shunt electrode PB1 configures the inductor L113 of FIG. 2. The inductance of the inductor L113 can be adjusted by changing the size of the shunt electrode PB1 in X-axis direction.

Note that the portions of the vias V10 and V11, between the capacitor electrode PC11 and the shunt electrode PB1, configure the inductor L111 of FIG. 2. The portions of the vias V10 and V11, between the capacitor electrode PC12 and the shunt electrode PB1, configure the inductor L112 of FIG. 2. The magnitude of (the ratio between) inductances of the inductors L111 and L112 can be adjusted by disposing the shunt electrode PB1 on a different dielectric layer.

The capacitor electrode PC21 is a rectangular or substantially rectangular plate electrode and disposed on the dielectric layer LY3. The capacitor electrode PC21, in plan view of the dielectric substrate 110 from the normal direction, partially overlaps with the ground electrode PG1 disposed on the dielectric layer LY2. The capacitor electrode PC21 and the ground electrode PG1 configure the capacitor C121 of FIG. 2. The capacitor electrode PC22 is a rectangular or substantially rectangular plate electrode and disposed on the dielectric layer LY9. The capacitor electrode PC22, in plan view of the dielectric substrate 110 from the normal direction, partially overlaps with the ground electrode PG2 disposed on the dielectric layer LY10. The capacitor electrode PC22 and the ground electrode PG2 configure the capacitor C122 of FIG. 2.

The capacitor electrode PC21 is connected to the capacitor electrode PC22 by the vias V20 and V21. The via V20 is connected to the connection electrode PA2 disposed on the dielectric layer LY4. The connection electrode PA2 is connected to the output terminal T2 via the side electrode 120.

The vias V20 and V21 are also connected to a shunt electrode PB2 disposed on the dielectric layer LY8. The shunt electrode PB2 is a strip-shaped plate electrode including a first end portion and a second end portion, the first end portion being connected to the side electrode 122, the second end portion being connected to the side electrode 123. In other words, the shunt electrode PB2 is connected between intermediate portions of the vias V20 and V21, and the ground terminal GND. The shunt electrode PB2 configures the inductor L123 of FIG. 2. The inductance of the inductor L123 can be adjusted by changing the size of the shunt electrode PB2 in X-axis direction.

Note that the portions of the vias V20 and V21 between the capacitor electrode PC21 and the shunt electrode PB2 configure the inductor L121 of FIG. 2. The portions of the vias V20 and V21 between the capacitor electrode PC22 and the shunt electrode PB2 configure the inductor L122 of FIG. 2. The magnitude of (the ratio between) the inductances of the inductors L121 and L122 can be adjusted by disposing the shunt electrode PB2 on a different dielectric layer.

The capacitor electrode PC31 is a rectangular or substantially rectangular plate electrode, and disposed on the dielectric layer LY3. The capacitor electrode PC31, in plan view of the dielectric substrate 110 from the normal direction, partially overlaps with the ground electrode PG1 disposed on the dielectric layer LY2. The capacitor electrode PC31 and the ground electrode PG1 configure the capacitor C131 of FIG. 2. The capacitor electrode PC32 is a rectangular or substantially rectangular plate electrode, and disposed on the dielectric layer LY9. The capacitor electrode PC32, in plan view of the dielectric substrate 110 from the normal direction, partially overlaps with the ground electrode PG2 disposed on the dielectric layer LY10. The capacitor electrode PC32 and the ground electrode PG2 configure the capacitor C132 of FIG. 2. The capacitor electrode PC31 is connected to the capacitor electrode PC32 by the via V30. The via V30 configures the inductor L131 of FIG. 2.

The capacitor electrode PC41 is a rectangular or substantially rectangular plate electrode, and disposed on the dielectric layer LY3. The capacitor electrode PC41, in plan view of the dielectric substrate 110 from the normal direction, partially overlaps with the ground electrode PG1 disposed on the dielectric layer LY2. The capacitor electrode PC41 and the ground electrode PG1 configure the capacitor C141 of FIG. 2. The capacitor electrode PC42 is a rectangular or substantially rectangular plate electrode, and disposed on the dielectric layer LY9. The capacitor electrode PC42, in plan view of the dielectric substrate 110 from the normal direction, partially overlaps with the ground electrode PG2 disposed on the dielectric layer LY10. The capacitor electrode PC42 and the ground electrode PG2 configure the capacitor C142 of FIG. 2. The capacitor electrode PC41 is connected to the capacitor electrode PC42 by the via V40. The via V40 configures the inductor L141 of FIG. 2.

The capacitor electrode PC11 of the resonator RC11 is disposed closer to the side surface 114 on the dielectric layer LY3, and the capacitor electrode PC21 of the resonator RC12 is disposed closer to the side surface 113 on dielectric layer LY3. The capacitor electrode PC31 of the resonator RC13 and the capacitor electrode PC41 of the resonator RC14 are disposed in parallel along X-axis, between the capacitor electrode PC11 and the capacitor electrode PC21 on the dielectric layer LY3. The capacitor electrodes PC12, PC22, PC32, and PC42 are also disposed on the dielectric layer LY9 in the same arrangement. The arrangement of the resonators shown in FIG. 4 is one example, and the resonator RC13 may be disposed between the resonator RC11 and the resonator RC12, and the resonator RC14 may be disposed between the resonator RC12 and the resonator RC13.

The resonator RC11 and the resonator RC12 are loop resonators in which two capacitor electrodes are connected by two vias. Including multiple vias as such can reduce the resistive component lying on a path between the capacitor electrodes and reduce the current flowing through the respective vias, thus improving the Q value, as compared to connecting two capacitor electrodes by a single via. Moreover, the resonator having a loop shape allows an increased diameter of the air core of a coil, which also improves the Q value. Note that the resonators RC13 and RC14 may also include capacitor electrodes that are connected by multiple vias.

As described above, since the filter device includes multiple resonators, including those galvanically isolated from the ground terminal, the coupling between the resonators can be changed from magnetic coupling to capacitive coupling for transmission characteristics, and the impedance of the ground side on the higher-frequency side can therefore be rendered capacitive. Thus, in addition to the improved attenuation characteristics of the higher-frequency side of the passband, attenuation poles are produced on the higher-frequency side of the passband.

Furthermore, in the filter device 100, the resonator RC11 connected to the input terminal T1 and the resonator RC12 connected to the output terminal T2 include the shunt electrodes PB1 and PB2, respectively. Due to the reduction in impedances of the lower-frequency sides of the resonators RC11 and RC12, caused by the shunt electrodes, and the inductances connected in series to the capacitors C112 and C122, attenuation poles are produced on the lower-frequency side of the passband.

Note that, while the shunt electrode may be included in either one of the resonator RC11 of the input side and the resonator RC12 of the output side, it is preferable that the shunt electrode is included in both the resonators RC11 and RC12 if the symmetrical nature of the input and output impedance characteristics of the filter is desired.

Figure 5:
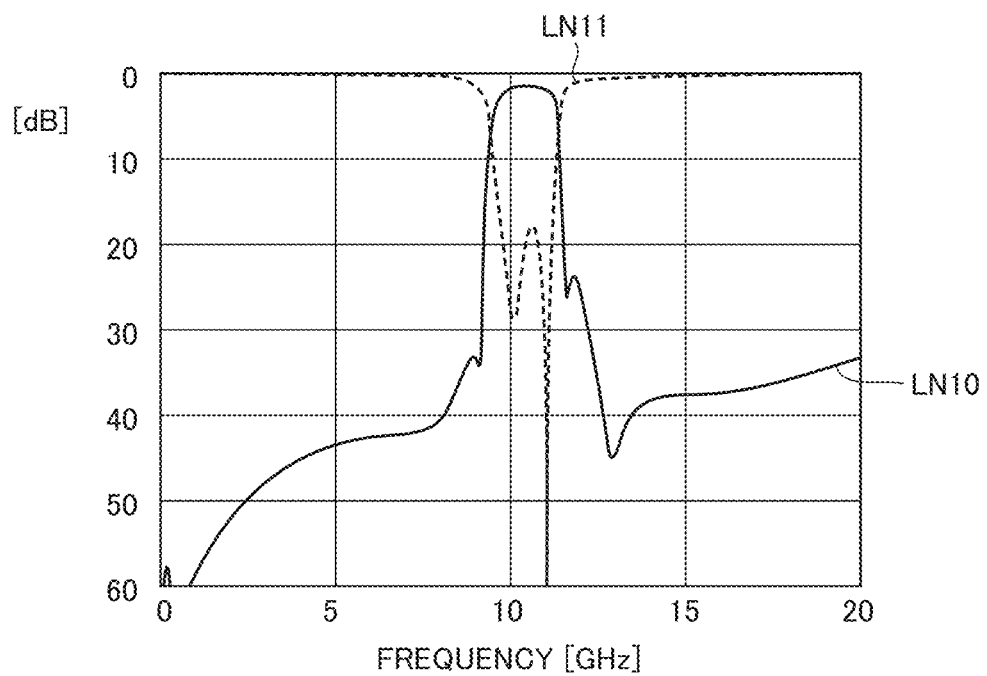
FIG. 5 is a diagram for illustrating bandpass characteristics of the filter device of FIG. 2.
Figure 5:
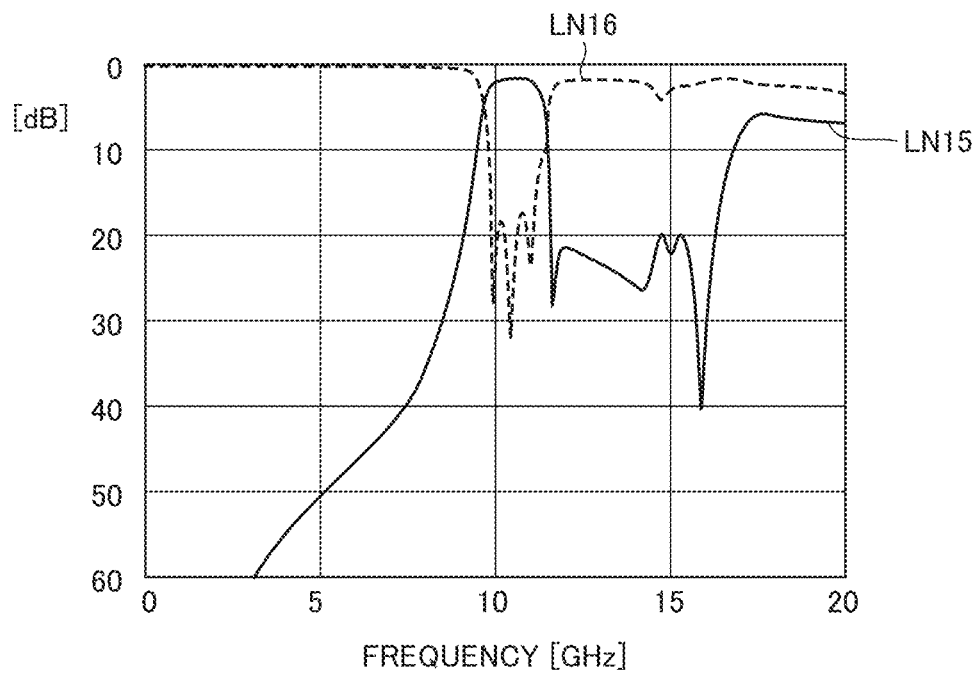

FIG. 5 is a diagram for illustrating bandpass characteristics of the filter device 100. In FIG. 5, the top row shows bandpass characteristics of the filter device 100, and the bottom row shows bandpass characteristics of a filter device according to Comparative Example. Note that the filter device according to Comparative Example is a band-pass filter which is the same as the filter device 100, except for not including the shunt electrodes PB1 and PB2. FIG. 5 shows solid lines LN10 and LN15 indicating insertion losses, and dashed lines LN11 and LN16 indicating return losses.

Referring to FIG. 5, in Comparative Example (the bottom row) that includes no shunt electrode, attenuation poles are produced on the higher-frequency side of the passband and no attenuation pole is produced on the lower-frequency side of the passband, as indicated by the solid line LN15. In contrast, for the filter device 100 according to Preferred Embodiment 1, attenuation poles are produced on both the higher-frequency side and the lower-frequency side of the passband. This suggests that the filter device 100 has an improved amount of attenuation and improved edge steepness of attenuation on the lower-frequency side of the passband, as compared to Comparative Example.

As described above, in the filter device that includes multiple resonators, the resonators are galvanically isolated and the resonators that are connected to the input and output terminals each include a shunt electrode, and attenuation poles are therefore produced on both the higher-frequency side and the lower-frequency side of the passband of the band-pass filter. This allows the filter device to have improved attenuation characteristics in the non-passband.

Note that the capacitors C111, C121, C131, and C141 configured of the capacitor electrodes PC11, PC21, PC31, and PC41 (first capacitor electrodes) have greater capacitances than the capacitors C112, C122, C132, and C142 configured of the capacitor electrodes PC12, PC22, PC32, and PC42 (second capacitor electrodes), and the ground electrode PG2 is disposed closer to the ground terminal GND than the ground electrode PG1 is. Such an arrangement can reduce or minimize the impact of the reduction in attenuation characteristics on the higher-frequency side due to the parasitic inductor of the ground terminal GND.

Specifically, the permittivity of the dielectric layer LY9 located between the ground electrode PG2 and the capacitor electrodes PC12, PC22, PC32, and PC42 (the second capacitor electrodes) is increased greater than the permittivity of the dielectric layer LY2 located between the ground electrode PG1 and the capacitor electrodes PC11, PC21, PC31, and PC41 (the first capacitor electrodes). Alternatively, the spacing between the ground electrode PG2 and the capacitor electrodes PC12, PC22, PC32, and PC42 (the second capacitor electrodes) is reduced to be shorter than the spacing between the ground electrode PG1 and the capacitor electrodes PC11, PC21, PC31, and PC41 (the first capacitor electrodes).

Note that while the example above has been described with reference to the filter device including four resonators, the filter device may include three resonators, excluding the resonator RC14.

Note that the "resonator RC11," "resonator RC12," "resonator RC13," and "resonator RC14" according to Preferred Embodiment 1 correspond to the "first LC resonator," "second LC resonator," "third LC resonator," and "fourth LC resonator," respectively. The "ground electrode PG1" and "ground electrode PG2" according to Preferred Embodiment 1 correspond to the "first ground electrode" and "second ground electrode," respectively. The "vias V10, V11, V20, V21, V30, and V40" included in the respective resonators according to Preferred Embodiment 1 correspond to a "first via". The "capacitor electrode PC11, PC21, PC31, and PC41" included in the respective resonators according to Preferred Embodiment 1 correspond to the "first capacitor electrode". The "capacitor electrodes PC12, PC22, PC32, PC42" included in the respective resonators according to Preferred Embodiment 1 correspond to the "second capacitor electrode". The "shunt electrode PB1" and "shunt electrode PB2" according to Preferred Embodiment 1 correspond to the "first shunt electrode" and the "second shunt electrode," respectively. The "side electrodes 122 and 123" according to Preferred Embodiment 1 correspond to the "first side electrode". The "side electrode 121" and "side electrode 120" according to Preferred Embodiment 1 correspond to the "second side electrode" and "third side electrode," respectively.

Preferred Embodiment 2

In Preferred Embodiment 2, a filter device capable of adjusting the input and output impedances is described.

Figure 6:
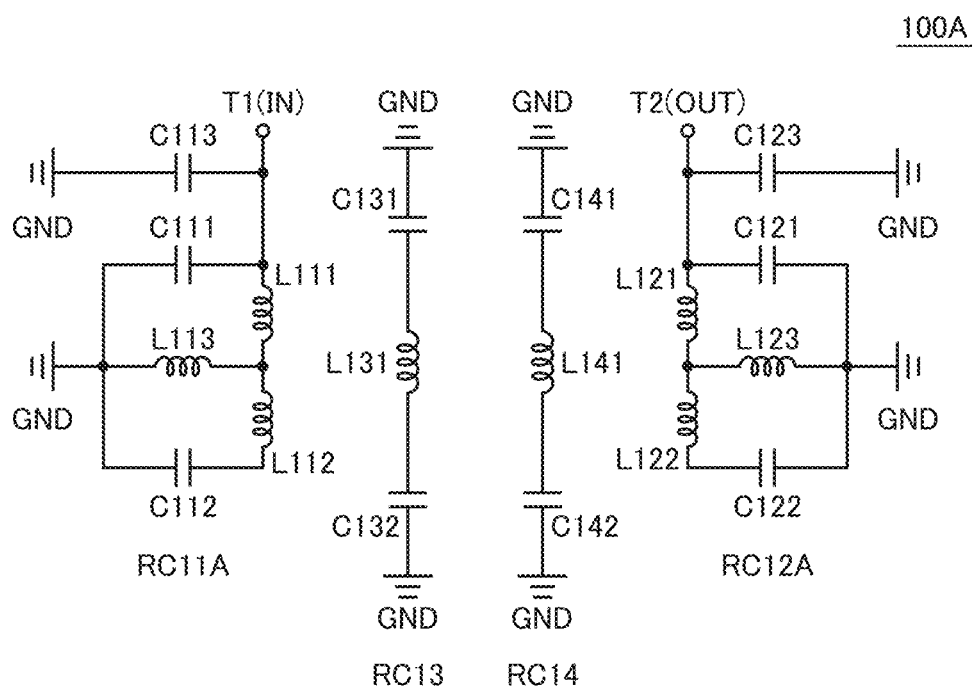
FIG. 6 is an equivalent circuit diagram of a filter device according to Preferred Embodiment 2 of the present invention.

FIG. 6 is an equivalent circuit diagram of a filter device 100A according to Preferred Embodiment 2. The filter device 100A further includes capacitors to adjust the impedance in the resonator RC11 on the input side and the resonator RC12 on the output side of the filter device 100 according to Preferred Embodiment 1 described with respect to FIG. 2. Note that in FIG. 6 and FIG. 7 described below, descriptions of the elements duplicating the elements of FIGS. 2 and 4 according to Preferred Embodiment 1 will not be repeated.

Referring to FIG. 6, the filter device 100A includes an input terminal T1, an output terminal T2, a ground terminal GND, and resonators RC11A, RC12A, RC13, and RC14, similarly to the filter device 100 according to Preferred Embodiment 1.

In contrast to the resonator RC11 included in the filter device 100, the resonator RC11A connected to the input terminal T1 further includes a capacitor C113 connected between the input terminal T1 and the ground terminal GND. In contrast to the resonator RC12 included in the filter device 100, the resonator RC12A connected to the output terminal T2 further includes a capacitor C123 connected between the output terminal T2 and the ground terminal GND. Note that the resonators RC13 and RC14 have the same configuration as the resonators RC13 and RC14 included in the filter device 100.

Depending on a device connected to the input terminal T1 and the output terminal T2 of the filter device 100A, the capacitor C113 included in the resonator RC11A and the capacitor C123 included in the resonator RC12A are adjusted, thus adjusting the impedance between the filter device 100A and the device. This attains a reduced return loss.

Figure 7:
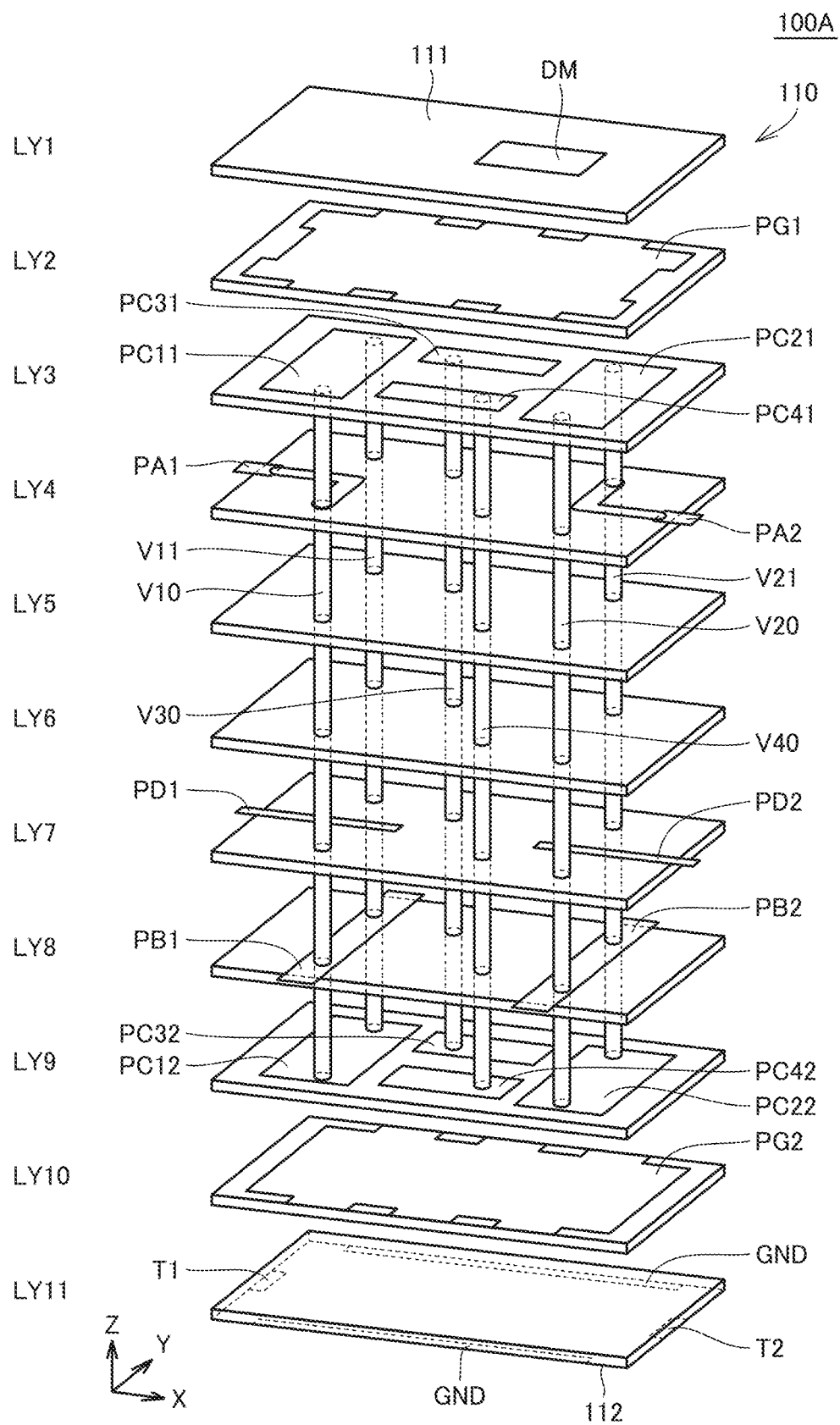
FIG. 7 is an exploded perspective view of one example of a multilayer structure of the filter device of FIG. 6.

FIG. 7 is an exploded perspective view of one example of a multilayer structure of the filter device 100A of FIG. 6. The filter device 100A of FIG. 7 further includes capacitor electrodes PD1 and PD2 in the dielectric layer LY7 in the exploded perspective view of the filter device 100 of FIG. 4.

The capacitor electrode PD1 is a strip-shaped plate electrode extending along X-axis. In plan view of a dielectric substrate 110 from the normal direction, the capacitor electrode PD1 partially overlaps with a shunt electrode PB1 disposed on a dielectric layer LY8. The capacitor electrode PD1 has one end connected to the input terminal T1 and a connection electrode PA1 via a side electrode 121 disposed on a side surface 114 of the dielectric substrate 110.

As described above, since the shunt electrode PB1 is connected to the ground terminal GND by side electrodes 122 and 123, the capacitor electrode PD1 and the shunt electrode PB1 configure the capacitor C113 of FIG. 6. As the overlapping area of the capacitor electrode PD1 with the shunt electrode PB1 is adjusted by varying the width of the capacitor electrode PD1, the capacitor C113 varies in capacitance. This allows adjustment to the input impedance of the filter device 100A.

The capacitor electrode PD2 is a strip-shaped plate electrode extending along X-axis. In plan view of the dielectric substrate 110 from the normal direction, the capacitor electrode PD2 partially overlaps with a shunt electrode PB2 disposed on the dielectric layer LY8. The capacitor electrode PD2 has one end connected to the output terminal T2 and a connection electrode PA2 via a side electrode 120 disposed on a side surface 113 of the dielectric substrate 110.

As described above, since the shunt electrode PB2 is connected to the ground terminal GND by the side electrodes 122 and 123, the capacitor electrode PD2 and the shunt electrode PB2 configure the capacitor C123 of FIG. 6. As the overlapping area of the capacitor electrode PD2 with the shunt electrode PB2 is adjusted by varying the width of the capacitor electrode PD2, the capacitor C123 varies in capacitance. This allows adjustment to the output impedance of the filter device 100A.

Figure 8:
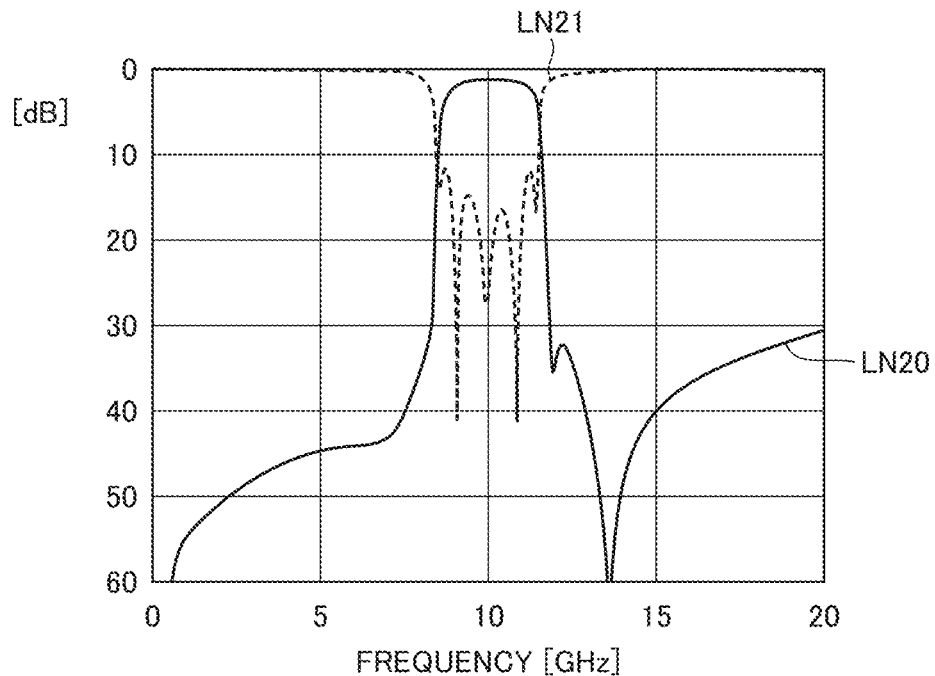
FIG. 8 is a diagram showing bandpass characteristics of the filter device of FIG. 6.

FIG. 8 is a diagram showing bandpass characteristics of the filter device 100A of FIG. 6. Note that FIG. 8 shows a solid line LN20 indicating an insertion loss, and a dashed line LN21 indicating a return loss.

Referring to FIG. 8, the filter device 100A includes the shunt electrodes PB1 and PB2 in the resonator RC11A connected to the input terminal T1 and the resonator RC12A connected to the output terminal T2, respectively, similarly to the filter device 100 according to Preferred Embodiment 1. Therefore, attenuation poles are produced on both the higher-frequency side and the lower-frequency side of the passband.

Furthermore, the filter device 100A allows optimal input and output impedance matching by the capacitor electrodes PD1 and PD2 included in the resonators RC11A and RC12A, respectively. This reduces an overall return loss in the passband, as compared to the filter device 100 of FIG. 5.

As described above, since the resonators connected to the input or output terminal include the shunt electrode and the capacitor electrode for adjusting the impedance, the filter device has improved attenuation characteristics in the non-passband and a reduced return loss in the passband. Note that the "resonator RC11A" and "resonator RC12A" according to Preferred Embodiment 2 correspond to the "first LC resonator" and "second LC resonator," respectively. The "capacitor electrode PD1" and "capacitor electrode PD2" according to Preferred Embodiment 2 correspond to the "third capacitor electrode" and "fourth capacitor electrode," respectively.

Preferred Embodiments 1 and 2 have been described with reference to the filter device including four resonators, for example. Preferred Embodiment 3 will be described with reference to a filter device including five resonators, for example.

Figure 9:
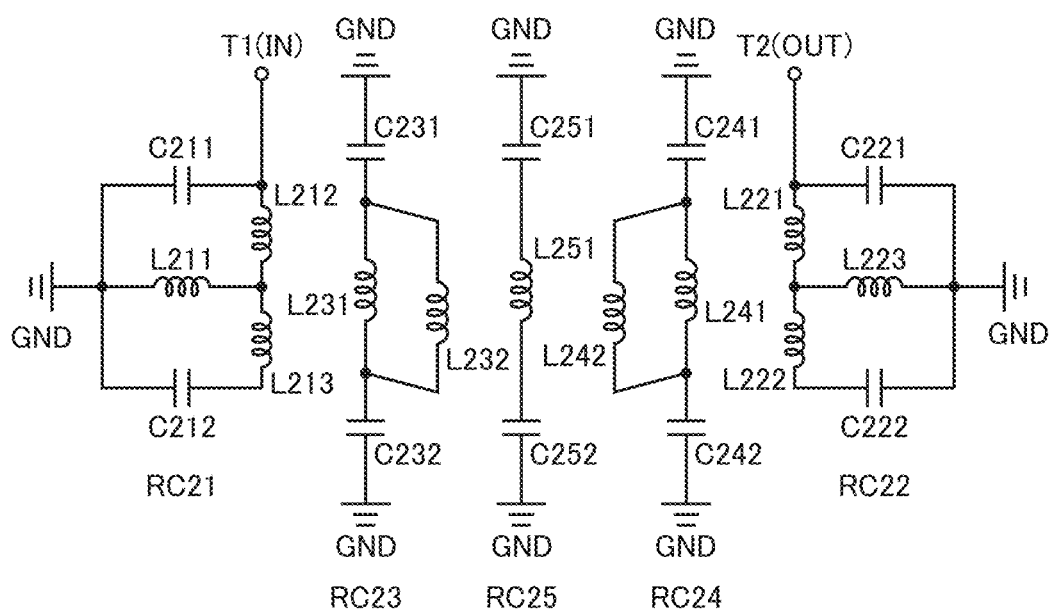
FIG. 9 is an equivalent circuit diagram of a filter device according to Preferred Embodiment 3 of the present invention.

FIG. 9 is an equivalent circuit diagram of a filter device 100B according to Preferred Embodiment 3. Referring to FIG. 9, the filter device 100B includes an input terminal T1, an output terminal T2, a ground terminal GND, and resonators RC21, RC22, RC23, RC24, and RC25. The resonators RC21 through RC25 are each an LC resonator which includes an inductor and a capacitor. The resonator RC21 is connected to the input terminal T1. The resonator RC22 is connected to the output terminal T2. The resonators RC23 through RC25 are disposed in the listed order between the resonator RC21 and the resonator RC22.

The resonator RC21 includes inductors L211, L212, and L213, and capacitors C211 and C212. The inductors L211 and L212 and the capacitor C212 are connected in series in the listed order between the input terminal T1 and the ground terminal GND. The inductor L213 is connected between the ground terminal GND and a connection node for the inductor L211 and the inductor L212. The capacitor C211 is connected between the input terminal T1 and the ground terminal GND.

The resonator RC22 includes inductors L221, L222, and L223, and capacitors C221 and C222. The inductors L221 and L222 and the capacitor C222 are connected in series in the listed order between the output terminal T2 and the ground terminal GND. The inductor L223 is connected between the ground terminal GND and a connection node for the inductor L221 and the inductor L222. The capacitor C221 is connected between the output terminal T2 and the ground terminal GND.

The resonator RC23 includes inductors L231 and L232 and capacitors C231 and C232. The inductor L231 has one end connected to the ground terminal GND via the capacitor C231. The inductor L231 has the other end connected to the ground terminal GND via the capacitor C232. The inductor L232 is connected in parallel to the inductor L231. The inductors L231 and L232 are galvanically isolated from the ground terminal GND by the capacitors C231 and C232.

The resonator RC24 includes inductors L241 and L242, and capacitors C241 and C242. The inductor L241 has one end connected to the ground terminal GND via the capacitor C241. The inductor L241 has the other end connected to the ground terminal GND via the capacitor C242. The inductor L242 is connected in parallel to the inductor L241. The inductors L241 and L242 are galvanically isolated from the ground terminal GND by the capacitors C241 and C242.

The resonator RC25 includes an inductor L251 and capacitors C251 and C252. The inductor L251 has one end connected to the ground terminal GND via the capacitor C251. The inductor L251 has the other end connected to the ground terminal GND via the capacitor C252. The inductor L251 is galvanically isolated from the ground terminal GND by the capacitors C251 and C252.

The resonators are electromagnetically coupled to each other. As such, the filter device 100B includes five stages of resonators disposed between the input terminal T1 and the output terminal T2, the resonators being electromagnetically coupled to each other. An RF signal input to the input terminal T1 is transferred through the electromagnetic coupling of the resonators RC21 through RC25, and is output through the output terminal T2. At this time, a signal in a frequency band determined by the resonance frequencies of the respective resonators is transferred to the output terminal T2. In other words, the filter device 100B functions as a band-pass filter that passes a signal in the desired frequency band by adjusting the resonance frequencies of the resonators.

Figure 10:
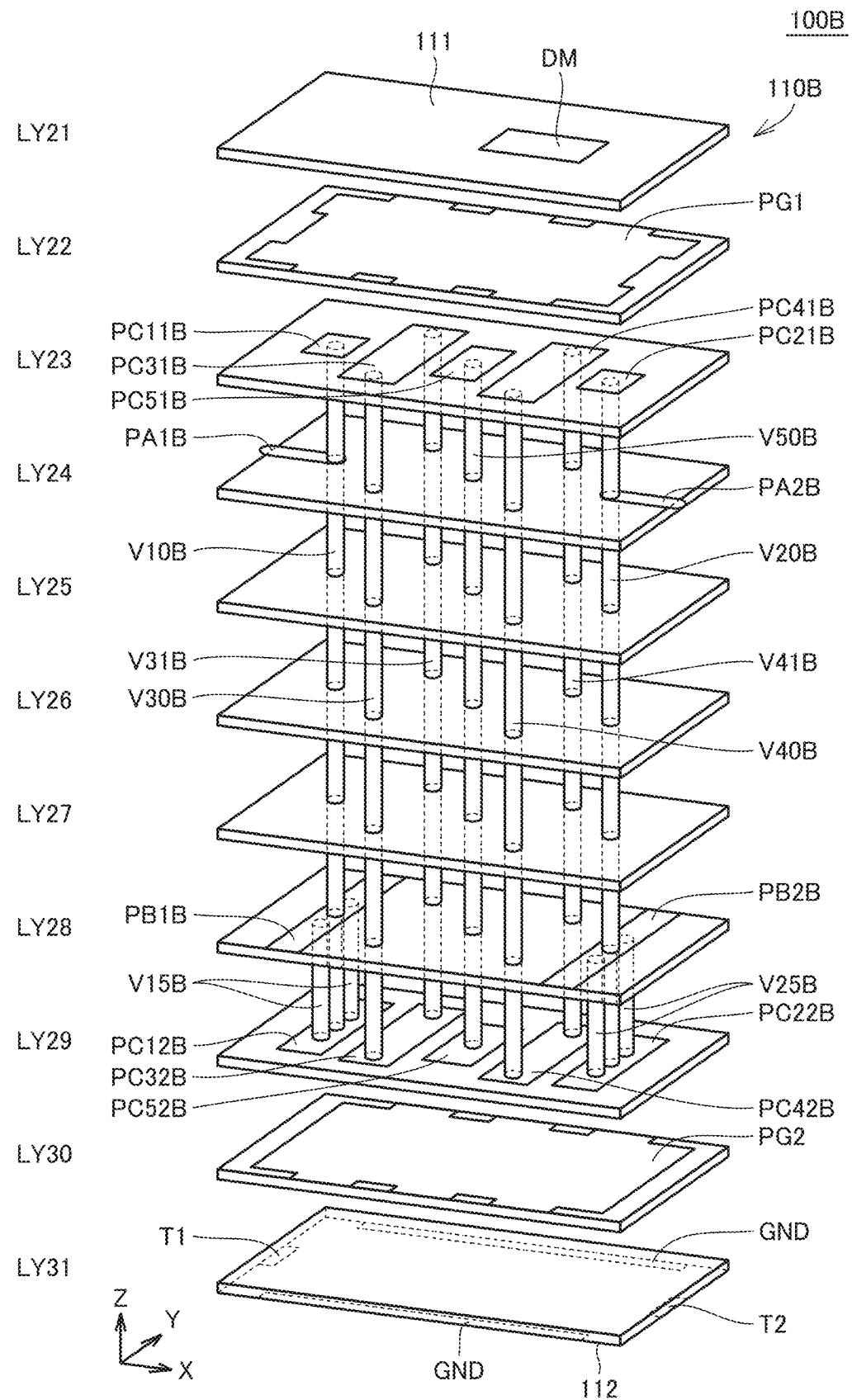
FIG. 10 is an exploded perspective view of one example of a multilayer structure of the filter device of FIG. 9.

FIG. 10 is an exploded perspective view of one example of a multilayer structure of the filter device 100B of FIG. 9. Referring to FIG. 10, the filter device 100B includes a cuboid or generally cuboid dielectric substrate 110B formed of multiple dielectric layers LY21, LY22, LY23, LY24, LY25, LY26, LY27, LY28, LY29, LY30, and LY31 being stacked along a predetermined direction. Similarly to the dielectric substrate 110 of the filter device 100, each dielectric layer of the dielectric substrate 110B is formed of ceramics such as LTCC or a resin, for example.

A directional marking DM is provided on the upper surface 111 (the dielectric layer LY21) of the dielectric substrate 110B to determine the direction of the filter device 100B. The input terminal T1, the output terminal T2, and the ground terminal GND are disposed on the lower surface 112 (the dielectric layer LY31) of the dielectric substrate 110B. Similarly to the filter device 100, the input terminal T1, the output terminal T2, and the ground terminal GND are connected to side electrodes disposed on the side surfaces of the dielectric substrate 110B.

A plate-shaped ground electrode PG1 is disposed on the dielectric layer LY22 of the dielectric substrate 110B. A plate-shaped ground electrode PG2 is disposed on the dielectric layer LY30 of the dielectric substrate 110B. The ground electrodes PG1 and PG2 are connected to the ground terminal GND disposed on the dielectric layer LY31, by the side electrodes.

As described with respect to FIG. 9, the filter device 100B includes five stages of LC resonators. More specifically, the filter device 100B includes the resonator RC21, the resonator RC22, the resonator RC23, the resonator RC24, and the resonator RC25. The resonator RC21 includes vias V10B and V15B and capacitor electrodes PC11B and PC12B. The resonator RC22 includes vias V20 and V25B and capacitor electrodes PC21B and PC22B. The resonator RC23 includes vias V30B and V31B and capacitor electrodes PC31B and PC32B. The resonator RC24 includes vias V40B and V41B and capacitor electrodes PC41B and PC42B. The resonator RC25 includes a via V50B and capacitor electrodes PC51B and PC52B.

The capacitor electrode PC11B is a rectangular or substantially rectangular plate electrode and disposed on the dielectric layer LY23. The capacitor electrode PC11B, in plan view of the dielectric substrate 110B from the normal direction, partially overlaps with the ground electrode PG1 disposed on the dielectric layer LY22. The capacitor electrode PC11B and the ground electrode PG1 configure the capacitor C211 of FIG. 9. The capacitor electrode PC12B is a rectangular or substantially rectangular plate electrode and disposed on the dielectric layer LY29. The capacitor electrode PC12B, in plan view of the dielectric substrate 110B from the normal direction, partially overlaps with the ground electrode PG2 disposed on the dielectric layer LY30. The capacitor electrode PC12B and the ground electrode PG2 configure the capacitor C212 of FIG. 9.

The capacitor electrode PC11B is connected to the capacitor electrode PC12B by the via V10B. The via V10B is connected to a connection electrode PA1B disposed on the dielectric layer LY24. The connection electrode PA1B is connected to the input terminal T1 via the side electrode 121.

The via V10B is also connected to a shunt electrode PB1B disposed on the dielectric layer LY28. The shunt electrode PB1B is a strip-shaped plate electrode including a first end portion and a second end portion, the first end portion and the second end portion being connected to the ground terminal GND via side electrodes 122 and 123, respectively. In other words, the shunt electrode PB1B is connected between an intermediate portion of the via V10B and the ground terminal GND. The shunt electrode PB1B configures the inductor L213 of FIG. 9. The inductance of the inductor L213 can be adjusted by changing the size of the shunt electrode PB1B in X-axis direction.

The shunt electrode PB1B and the capacitor electrode PC12B are also connected by the via V15B, besides the via V10B. A portion of the via V10B, between the capacitor electrode PC11B and the shunt electrode PB1B, configures the inductor L211 of FIG. 9. A portion of the via V10B, between the capacitor electrode PC12B and the shunt electrode PB1B, and the via V15B configure the inductor L212 of FIG. 9. The magnitude of (the ratio between) inductances of the inductors L211 and L212 can be adjusted by disposing the shunt electrode PB1B on a different dielectric layer. The magnitude of inductance of the inductor L212 can also be adjusted by changing the number of vias V15B. Note that the via V15B may be omitted if a desired inductance can be attained by the via V10B.

The capacitor electrode PC21B is a rectangular or substantially rectangular plate electrode, and disposed on the dielectric layer LY23. The capacitor electrode PC21B, in plan view of the dielectric substrate 110B from the normal direction, partially overlaps with the ground electrode PG1 disposed on the dielectric layer LY22. The capacitor electrode PC21B and the ground electrode PG1 configure the capacitor C221 of FIG. 9. The capacitor electrode PC22B is a rectangular or substantially rectangular plate electrode, and disposed on the dielectric layer LY29. The capacitor electrode PC22B, in plan view of the dielectric substrate 110B from the normal direction, partially overlaps with the ground electrode PG2 disposed on the dielectric layer LY30. The capacitor electrode PC22B and the ground electrode PG2 configure the capacitor C222 of FIG. 9.

The capacitor electrode PC21B is connected to the capacitor electrode PC22B by the via V20B. The via V20B is connected to a connection electrode PA2B disposed on the dielectric layer LY24. The connection electrode PA2B is connected to the output terminal T2 via the side electrode 120.

The via V20B is also connected to the shunt electrode PB2B disposed on the dielectric layer LY28. The shunt electrode PB2B is a strip-shaped plate electrode having a first end portion and a second end portion, the first end portion and the second end portion being connected to the ground terminal GND via the side electrodes. In other words, the shunt electrode PB2B is connected between an intermediate portion of the via V20B and the ground terminal GND. The shunt electrode PB2B configures the inductor L223 of FIG. 9. The inductance of the inductor L223 can be adjusted by changing the size of the shunt electrode PB2B in X-axis direction.

The shunt electrode PB2B and the capacitor electrode PC22B are also connected by the via V25B, besides the via V20B. A portion of the via V20B, between the capacitor electrode PC21B and the shunt electrode PB2B, configures the inductor L221 of FIG. 9. A portion of the via V20B, between the capacitor electrode PC22B and the shunt electrode PB2B, and the via V25B configure the inductor L222 of FIG. 9. The magnitude of (the ratio between) inductances of the inductors L221 and L222 can be adjusted by disposing the shunt electrode PB2B on a different dielectric layer. The magnitude of inductance of the inductor L222 can also be adjusted by changing the number of vias V25B. Note that the via V25B may be omitted if a desired inductance can be attained by the via V20B.

The capacitor electrode PC31B is a rectangular or substantially rectangular plate electrode, and disposed on the dielectric layer LY23. The capacitor electrode PC31B, in plan view of the dielectric substrate 110B from the normal direction, partially overlaps with the ground electrode PG1 disposed on the dielectric layer LY22. The capacitor electrode PC31B and the ground electrode PG1 configure the capacitor C231 of FIG. 9. The capacitor electrode PC32B is a rectangular or substantially rectangular plate electrode, and disposed on the dielectric layer LY29. The capacitor electrode PC32B, in plan view of the dielectric substrate 110B from the normal direction, partially overlaps with the ground electrode PG2 disposed on the dielectric layer LY30. The capacitor electrode PC32B and the ground electrode PG2 configure the capacitor C232 of FIG. 9. The capacitor electrode PC31B is connected to the capacitor electrode PC32B by the vias V30B and V31B. The vias V30B and V31B configure the inductors L231 and L232 of FIG. 9.

The capacitor electrode PC41B is a rectangular or substantially rectangular plate electrode, and disposed on the dielectric layer LY23. The capacitor electrode PC41B, in plan view of the dielectric substrate 110B from the normal direction, partially overlaps with the ground electrode PG1 disposed on the dielectric layer LY22. The capacitor electrode PC41B and the ground electrode PG1 configure the capacitor C241 of FIG. 9. The capacitor electrode PC42B is a rectangular or substantially rectangular plate electrode, and disposed on the dielectric layer LY29. The capacitor electrode PC42B, in plan view of the dielectric substrate 110B from the normal direction, partially overlaps with the ground electrode PG2 disposed on the dielectric layer LY30. The capacitor electrode PC42B and the ground electrode PG2 configure the capacitor C242 of FIG. 9. The capacitor electrode PC41B is connected to the capacitor electrode PC42B by the vias V40B and V41B. The vias V40B and V41B configure the inductors L241 and L242 of FIG. 9.

The capacitor electrode PC51B is a rectangular or substantially rectangular plate electrode, and disposed on the dielectric layer LY23. The capacitor electrode PC51B, in plan view of the dielectric substrate 110B from the normal direction, partially overlaps with the ground electrode PG1 disposed on the dielectric layer LY22. The capacitor electrode PC51B and the ground electrode PG1 configure the capacitor C251 of FIG. 9. The capacitor electrode PC52B is a rectangular or substantially rectangular plate electrode, and disposed on the dielectric layer LY29. The capacitor electrode PC52B, in plan view of the dielectric substrate 110B from the normal direction, partially overlaps with the ground electrode PG2 disposed on the dielectric layer LY30. The capacitor electrode PC52B and the ground electrode PG2 configure the capacitor C252 of FIG. 9. The capacitor electrode PC51B is connected to the capacitor electrode PC52B by the via V50B. The via V50B configures the inductor L251 of FIG. 9.

Note that the capacitor electrode PC11B, the capacitor electrode PC31B, the capacitor electrode PC51B, the capacitor electrode PC41B, and the capacitor electrode PC21B are disposed on the dielectric layer LY23 of the dielectric substrate 110B in the listed order, from the side surface 114 to the side surface 113 of the dielectric substrate 110B. Similarly, the capacitor electrode PC12B, the capacitor electrode PC32B, the capacitor electrode PC52B, the capacitor electrode PC42B, and the capacitor electrode PC22B are disposed on the dielectric layer LY29 in the listed order, from the side surface 114 to the side surface 113 of the dielectric substrate 110B.

The resonators RC23 and RC24, included in the filter device 100B of FIG. 10, are loop resonators in which two capacitor electrodes are connected by two vias. The resonators RC23 and RC24 including multiple vias can reduce the resistive component lying on a path between the capacitor electrodes and reduce the current flowing through the respective vias, thus improving the Q value, as compared to connecting two capacitor electrodes by a single via. Moreover, the resonator having a loop shape allows an increased diameter of the air core of a coil, which also improves the Q value. Note that the resonator RC25 may be a loop resonator.

Figure 11:
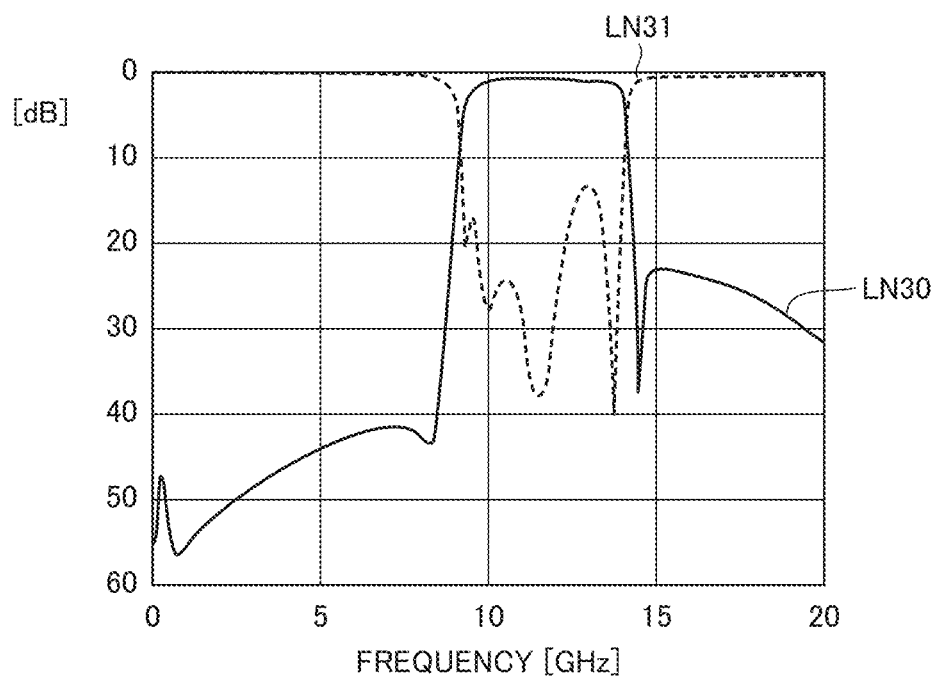
FIG. 11 is a diagram showing bandpass characteristics of the filter device of FIG. 9.

FIG. 11 is a diagram showing bandpass characteristics of the filter device 100B of FIG. 9. FIG. 11 shows a solid line LN30 indicating an insertion loss, and a dashed line LN31 indicating a return loss.

Referring to FIG. 11, it can be seen that attenuation poles are produced on both the higher-frequency side and the lower-frequency side of the passband in the filter device 100B, as indicated by the solid line LN30. This allows the filter device 100B to have improved attenuation characteristics in the non-passbands, which are the higher-frequency side and the lower-frequency side of the passband.

In general, it is known that an increase in number of stages of resonators increases the amount of attenuation in the non-passband. In FIG. 11, the amount of attenuation of the attenuation pole on the lower-frequency side of the passband is approximately 43 dB, achieving an amount of attenuation greater than the amount of attenuation (approximately 34 dB) attained by the filter device 100 including the four stages of resonators of FIG. 5 according to Preferred Embodiment 1.

Note that the example described above has been set forth with reference to the filter device having five resonators, the filter device may include six or more stages of resonators. However, an increase in number of stages of resonators tends to render the passband characteristics wideband characteristics. Accordingly, the number of stages of resonators is determined in consideration of balancing between a target amount of attenuation and the passband width.

As described above, in the filter device including five or more resonators, the resonators are galvanically isolated and the resonators connected to the input or output terminal each include a shunt electrode, thus producing attenuation poles on both the higher-frequency side and the lower-frequency side of the passband of the band-pass filter. This allows the filter device to have improved attenuation characteristics in the non-passband.

Note that, in Preferred Embodiment 3, the "resonator RC21," "resonator RC22," "resonator RC23," "resonator RC24," and "resonator RC25" correspond to the "first LC resonator," "second LC resonator," "third LC resonator," "fourth LC resonator," and "fifth LC resonator," respectively. The "via V10B, V20B, V30B, V31B, V40B, V41B, and V50B" included in the respective resonators according to Preferred Embodiment 4 correspond to the "first via". The "via V15B" and "via 25B" according to Preferred Embodiment 4 correspond to the "second via" and "third via," respectively. The "capacitor electrodes PC11B, PC21B, PC31B, PC41B, and PC51B" included in the respective resonators according to Preferred Embodiment 4 correspond to the "first capacitor electrode". The "capacitor electrodes PC12B, PC22B, PC32B, PC42B, and PC52B" included in the respective resonators according to Preferred Embodiment 4 correspond to the "second capacitor electrode". The "shunt electrode PB1B" and "shunt electrode PB2B" according to Preferred Embodiment 4 correspond to the "first shunt electrode" and "second shunt electrode," respectively.

Preferred Embodiment 4

In the preferred embodiments described above, the side electrodes disposed on the side surfaces of the dielectric substrate 110 are used to connect between the ground electrodes PG1 and PG2 and the ground terminal GND, between the connection electrode PA1 and the input terminal T1, and between the connection electrode PA2 and the output terminal T2.

Preferred Embodiment 4 will be described, with reference to using vias in a dielectric substrate to connect between those external terminals, rather than the side electrodes.

Figure 12:
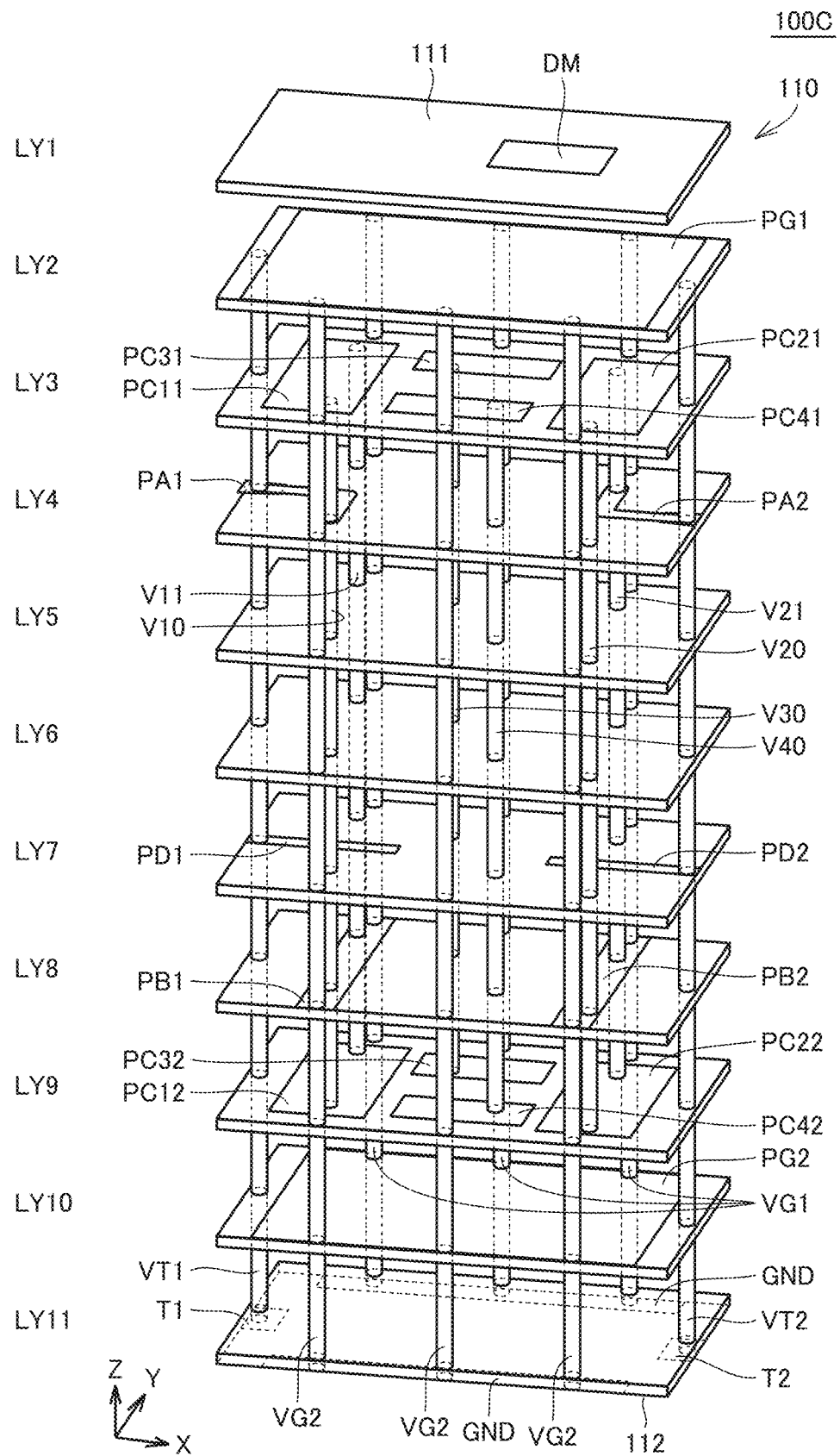
FIG. 12 is an exploded perspective view of one example of a multilayer structure of a filter device according to Preferred Embodiment 4 of the present invention.

FIG. 12 is an exploded perspective view of one example of a multilayer structure of a filter device 100C according to Preferred Embodiment 4. The filter device 100C of FIG. 12 further includes vias VT1, VT2, VG1, and VG2, in addition to the configuration of the filter device 100A according to Preferred Embodiment 2. Although not shown, the filter device 100C does not include the side electrodes 120 through 123 of FIG. 2. Note that descriptions of the elements in FIG. 12 duplicating the elements of FIG. 7, will not be repeated.

Referring to FIG. 12, the filter device 100C includes the vias VT1, VT2, VG1, and VG2 extending from a dielectric layer LY2 to a dielectric layer LY11, along the side surfaces of the dielectric substrate 110. More specifically, the via VT1 extends from the dielectric layer LY2 to the dielectric layer LY11, along a side surface 114 of the dielectric substrate 110. The via VT1 is connected to a connection electrode PA1, a capacitor electrode PD1, and an input terminal T1.

Similarly, the via VT2 extends from the dielectric layer LY2 to the dielectric layer LY11, along a side surface 113 of the dielectric substrate 110. The via VT2 is connected to a connection electrode PA2, a capacitor electrode PD2, and an output terminal T2.

In addition, multiple vias VG1 extend from the dielectric layer LY2 to the dielectric layer LY11, along a side surface 115 of the dielectric substrate 110. Multiple vias VG2 extend from the dielectric layer LY2 to the dielectric layer LY11, along a side surface 116 of the dielectric substrate 110. The vias VG1 and VG2 are connected to a ground electrode PG1, a ground electrode PG2, and a ground terminal GND.

With such a configuration, the filter device 100C and an external device are connected by the input terminal T1, the output terminal T2, and the ground terminal GND that are disposed on the lower surface 112. In other words, the filter device 100C has a land grid array (LGA) terminal structure.

Such a configuration obviates the need for the connections using the side electrodes, thereby attaining a reduced mounting surface area.

Note that the "vias VG1 and VG2" according to Preferred embodiment 4 correspond to a "fourth via". The "via VT1" and "via VT2" according to Preferred embodiment 4 correspond to a "fifth via" and a "sixth via," respectively.

The presently disclosed preferred embodiments should be considered in all aspects as illustrative and not restrictive. The scope of the present invention is defined by the appended claims, rather than by the description of the preferred embodiments above. All changes which come within the meaning and range of equivalency of the appended claims are to be embraced within their scope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device, comprising:
    a dielectric substrate;
    an input terminal;
    an output terminal;
    a ground terminal;
    a first ground electrode and a second ground electrode located at different positions in a normal direction of the dielectric substrate and connected to the ground terminal; and
    a plurality of resonators between the first ground electrode and the second ground electrode in the normal direction and electromagnetically coupled to each other; wherein
    each of the plurality of resonators includes:
        a first capacitor electrode partially overlapping with the first ground electrode in plan view of the dielectric substrate from the normal direction;
        a second capacitor electrode partially overlapping with the second ground electrode in plan view of the dielectric substrate from the normal direction; and
        at least one first via connecting the first capacitor electrode and the second capacitor electrode; and
    the plurality of resonators includes:
        a first resonator connected to the input terminal;
        a second resonator connected to the output terminal; and
        a third resonator between the first resonator and the second resonator; and
    the filter device further comprises:
        a first shunt electrode connected to the at least one first via included in the first resonator and the ground terminal; and
        a third capacitor electrode connected to the input terminal and partially overlapping with the first shunt electrode in plan view of the dielectric substrate from the normal direction.

2. The filter device according to claim 1, wherein in at least one of the plurality of resonators, the first capacitor electrode and the second capacitor electrode are connected together by a plurality of the first vias.

3. The filter device according to claim 1, further comprising:
    a second shunt electrode connected to the at least one first via included in the second resonator and the ground terminal; wherein
    each of the first shunt electrode and the second shunt electrode is strip shaped and includes a first end portion and a second end portion connected to the ground terminal.

4. The filter device according to claim 1, wherein
    the first resonator further includes a second via connecting the second capacitor electrode included in the first resonator and the first shunt electrode.

5. The filter device according to claim 1, wherein the filter device is a band-pass filter.

6. The filter device according to claim 1, further comprising:
    a second shunt electrode connected to the at least one first via included in the second resonator and the ground terminal; wherein
    the second resonator further includes a third via connecting the second capacitor electrode included in the second resonator and the second shunt electrode.

7. The filter device according to claim 1, further comprising:
    a second shunt electrode connected to the at least one first via included in the second resonator and the ground terminal; and
    a fourth capacitor electrode connected to the output terminal and partially overlapping with the second shunt electrode in plan view of the dielectric substrate from the normal direction.

8. The filter device according to claim 1, further comprising:
    a first side electrode located on a side surface of the dielectric substrate and connecting the first ground electrode and the second ground electrode to the ground terminal.

9. The filter device according to claim 1, further comprising:
    a fourth via within the dielectric substrate and connecting the first ground electrode and the second ground electrode to the ground terminal.

10. The filter device according to claim 1, further comprising:
    a second side electrode located on a side surface of the dielectric substrate and connecting the first resonator and the input terminal; and
    a third side electrode located on a side surface of the dielectric substrate and connecting the second resonator and the output terminal.

11. The filter device according to claim 1, further comprising:
    a fifth via within the dielectric substrate and connecting the first resonator and the input terminal; and
    a sixth via within the dielectric substrate and connecting the second resonator and the output terminal.

12. The filter device according to claim 1, wherein the plurality of resonators further include a fourth resonator between the second resonator and the third resonator.

13. The filter device according to claim 12, wherein the plurality of resonators further include a fifth resonator between the third resonator and the fourth resonator.

14. The filter device according to claim 1, wherein
    the second ground electrode is closer to the ground terminal than the first ground electrode; and
    a dielectric layer between the second capacitor electrode and the second ground electrode has a higher permittivity than a dielectric layer between the first capacitor electrode and the first ground electrode.

15. The filter device according to claim 1, wherein
the second ground electrode is closer to the ground terminal than the first ground electrode; and
a distance between the second capacitor electrode and the second ground electrode is shorter than a distance between the first capacitor electrode and the first ground electrode.

16. A radio-frequency front end circuit comprising the filter device according to claim 1.

17. The radio-frequency front end circuit according to claim 16, wherein
the first resonator further includes a second via connecting the second capacitor electrode included in the first resonator and the first shunt electrode.

18. The radio-frequency front end circuit according to claim 16, wherein in at least one of the plurality of resonators, the first capacitor electrode and the second capacitor electrode are connected together by a plurality of the first vias.

19. The radio-frequency front end circuit according to claim 16, wherein
the filter device further comprises a second shunt electrode connected to the at least one first via included in the second resonator and the ground terminal; and
each of the first shunt electrode and the second shunt electrode is strip shaped and includes a first end portion and a second end portion connected to the ground terminal.

* * * * *